United States Patent [19]

Mazzali

[11] Patent Number: 5,590,075

[45] Date of Patent: Dec. 31, 1996

[54] METHOD FOR TESTING AN ELECTRICALLY ERASABLE AND PROGRAMMABLE MEMORY DEVICE

[75] Inventor: Stefano Mazzali, Carnate, Italy

[73] Assignee: SGS-Thomson Microelectronics S.r.l., Agrate Brianza, Italy

[21] Appl. No.: 479,081

[22] Filed: Jun. 7, 1995

[30] Foreign Application Priority Data

Jun. 7, 1994 [EP] European Pat. Off. .............. 94830276

[51] Int. Cl.$^6$ .................................................. G11C 7/00
[52] U.S. Cl. ................... 365/185.22; 365/185.09; 365/185.29; 365/200; 365/201
[58] Field of Search ............... 365/185.22, 185.09, 365/185.29, 200, 201

[56] References Cited

U.S. PATENT DOCUMENTS

| | | | |
|---|---|---|---|
| 4,733,394 | 3/1988 | Giebel | 371/21 |
| 4,963,825 | 10/1990 | Mielke | 324/158 R |
| 5,023,874 | 6/1991 | Houston | 371/21.2 |
| 5,053,990 | 10/1991 | Kreifels et al. | 365/185.22 |
| 5,400,286 | 3/1995 | Chu et al. | 365/185.22 |
| 5,410,511 | 4/1995 | Michiyama | 365/185.22 |

FOREIGN PATENT DOCUMENTS

| | | | |
|---|---|---|---|
| 0392895 | 10/1990 | European Pat. Off. | G11C 16/06 |
| 0570597 | 11/1993 | European Pat. Off. | G11C 16/06 |
| 5205491 | 8/1993 | Japan | G11C 16/06 |
| 6005087 | 1/1994 | Japan | G11C 16/06 |

OTHER PUBLICATIONS

Vancu et al., "A 30 ns Fault Tolerant 16K CMOS EEPROM," in *IEEE Solid–State Circuits Conference*, vol. 31, New York, NY, Feb. 17–19, 1988, pp. 128 and 328.

*Primary Examiner*—David C. Nelms
*Assistant Examiner*—Vu A. Le
*Attorney, Agent, or Firm*—David V. Carlson; Harry K. Ahn; Seed and Berry LLP

[57] ABSTRACT

A method for testing an electrically erasable and programmable memory device comprising a matrix of memory cells and redundancy memory cells for functionally substituting defective memory cells, comprises the steps of: programing all the memory cells of the memory device; submitting all the memory cells of the memory device to a preliminary electrical erasure for a time much shorter than an average erasing time of the memory cells; reading the information stored in all the memory cells of the memory device; memorizing the addresses of defective memory cells which have been read as erased memory cell; storing the addresses of the defective memory cells in redundancy registers associated to redundancy memory cells which must substitute the defective memory cells.

12 Claims, 1 Drawing Sheet

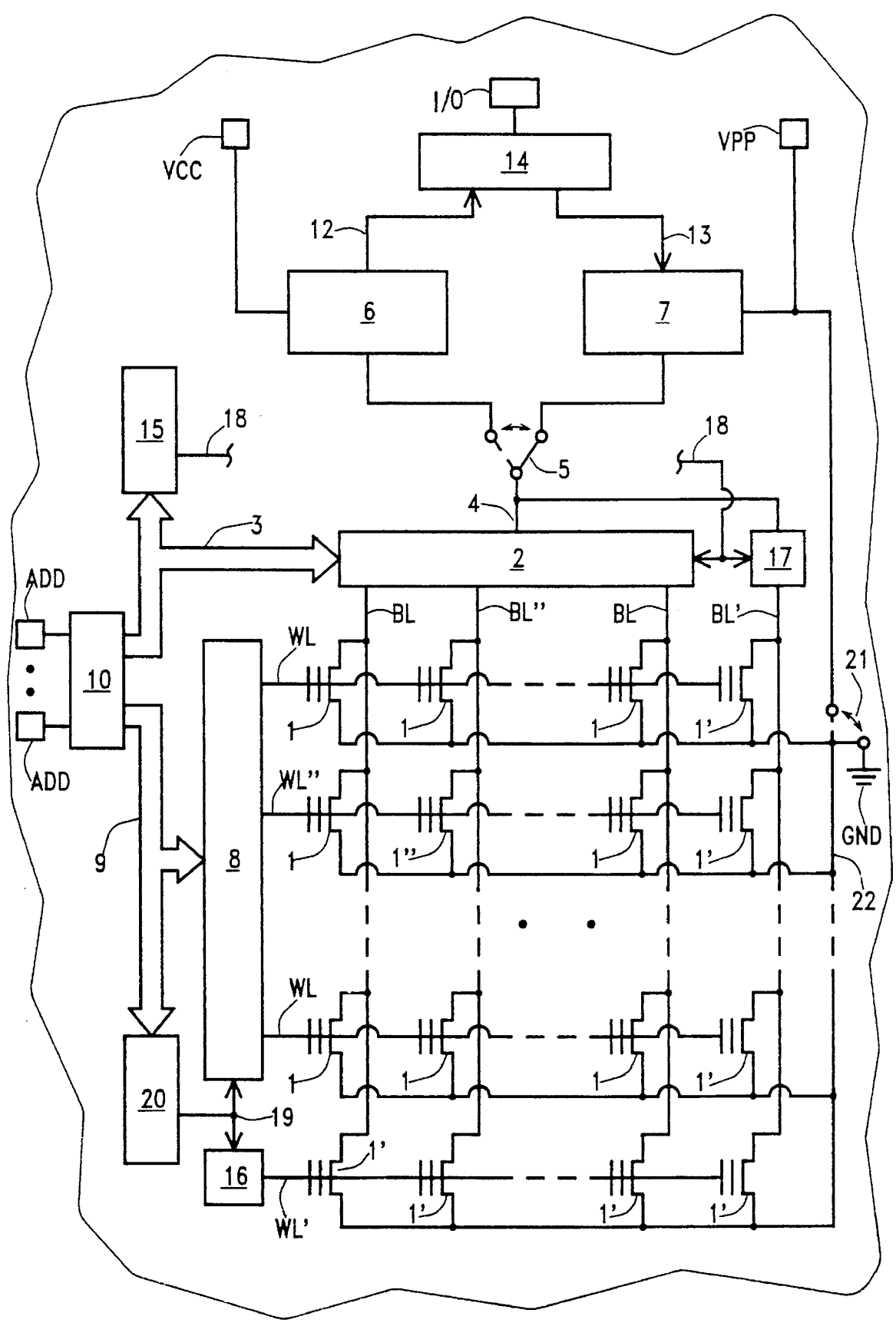

METHOD FOR TESTING AN ELECTRICALLY ERASABLE AND PROGRAMMABLE MEMORY DEVICE

TECHNICAL FIELD

The present invention relates to a method for in-factory testing of Flash EEPROM devices.

BACKGROUND OF THE INVENTION

One of the most important characteristics of Flash EEPROM (Electrically Erasable and Programmable Read-Only Memory) devices is the program/erase cycle endurance (also called "reliability in cycling"), i.e., the number of electrical program/erase cycles to which the memory device can be submitted before a failure occurs. For next-generation Flash EEPROM devices, the manufacturers may be capable of assuring to the customers the full operability for up to 100,000 or even 1,000,000 program/erase cycles.

Flash EEPROM cells are structurally quite similar to UV EPROM cells, the only difference consisting in the gate oxide thickness: while in fact in UV EPROM cells the thickness of the gate oxide is about 200 Angstroms, Flash EEPROM cells are characterized by a gate oxide thickness of the order of 120 Angstroms. This is due to the different erasing mechanism (the mechanism by which electrons are removed from the cell's floating gate) for the two kinds of memory cells, namely electron tunneling through the gate oxide (which is therefore called "tunnel oxide") instead of UV light exposure. Since for tunneling to take place an electric field of about 10 MV/cm across the tunnel oxide is necessary, an oxide thickness of 200 Angstroms would require voltages of about 20 V, which VLSI circuits often cannot withstand; with a tunnel oxide of about 120 Angstroms, the voltages necessary to build up the required electric field drop to 11–13 V.

It has been recognized that the reliability in cycling depends on the tunnel oxide quality; this is not easy to assure, since thin oxide layers are affected by high defectivity.

A typical failure which a Flash EEPROM cell can incur when it is submitted to some thousands of program/erase cycles is the lowering of its erased-state ("1"-state) threshold voltage to negative values, which transforms the memory cell into a depletion-mode (i.e., depleted) transistor. Since a depleted memory cell always conducts a channel current even when it is not addressed, a leakage on the memory matrix bit line to which the depleted cell belongs takes place, preventing the correct reading of a programmed ("0"-state) memory cell also connected to said bit line. In-factory testing has shown that memory cells affected by this problem are randomly distributed, and after some program/erase cycles, they recover from the depleted condition.

Another typical failure which randomly affects memory cells in a Flash EEPROM device is called "gain degradation," which consists in the lowering of the "1"-state channel current of the memory cell to such a level that such cell can no longer be identified as an erased cell by the sensing circuitry of the memory device. In contrast to the above-mentioned problem, gain degradation is permanent.

Some of the memory cells subjected to gain degradation failure are characterized by anomalous erasing times: while the electrical erasure of standard memory cells requires on the average 1 s, memory cells are encountered, which after 10 ms, are almost completely erased; such memory cells are called "fast erase bits". Differently from what could be expected, at the end of the erasing procedure, such memory cells achieve a very low threshold voltage, but are not depleted. This feature characterizes the fast erase bits with respect to those memory cells affected by depletion failure: also these fast erase bits are in fact erased faster than the average memory cell, but there is no lower limit to their threshold voltage, which can become negative.

The mechanism at the basis of the fast-erase-bit behavior has not been univocally determined yet. Two explanations have been proposed: one assumes that a localized thinning of the tunnel oxide takes place, causing a localized increase in the electric field; electron tunneling occurs in the region where the electric field is higher, and the erasing time, which depends exponentially on the electric field, is therefore greatly reduced. Another possible explanation is the existence of energy levels, introduced by charge traps within the tunnel oxide, which reduces the energy gap between the conduction and valence energy bands of the oxide; this defect could be activated after a given number of program/erase cycles.

SUMMARY OF THE INVENTION

In view of the state of the art described, an object of the present invention is to provide a method for in-factory testing of Flash EEPROM devices suitable to identify the existence of fast erase bits.

According to one aspect of the present invention, such object is attained by means of a method for in-factory testing of a flash EEPROM device comprising a matrix of memory cells and redundancy memory cells for functionally substituting defective memory cells, characterized by comprising the following steps:

a) programming all the memory cells of the memory device;

b) submitting all the memory cells of the memory device to a preliminary electrical erasure for a time much shorter than an average erasing time of the memory cells;

c) reading the information stored in all the memory cells of the memory device;

d) memorizing the addresses of defective memory cells which at step c) have been read as erased memory cells;

e) storing the addresses of the defective memory cells in redundancy registers of the memory device, associated to redundancy memory cells which must substitute the defective memory cells.

The method according to one aspect of the present invention allows a preliminary, in-factory screening of the memory device to detect the existence of fast erase bits which, after an unknown number of program/erase cycles, would cause the failure of the memory device; the fast erase bits, if present, are functionally replaced by redundancy memory cells, normally provided in memory devices to substitute for defective memory cells. It has been experimentally proven that about 50% of the defects causing the failure of the memory device can in this way be detected and repaired during in-factory testing. This greatly improves the endurance of the memory device chips sold by the manufacturer.

BRIEF DESCRIPTION OF THE DRAWING

These and other features of the present invention will be made more evident by the following detailed description of one particular embodiment, illustrated in the drawing as a non-limiting example.

The FIGURE schematically represents a Flash EEPROM device.

DETAILED DESCRIPTION OF THE INVENTION

A Flash EEPROM device comprises in a per-se known way a bidimensional array (called a "memory matrix") of memory cells 1, represented by stacked-gate MOS transistors; the memory cells 1 are located at the intersection of rows WL ("word lines") and columns BL ("bit lines").

In the following discussion, it is supposed for simplicity that the Flash EEPROM device has a single-bit data bus; as known to anyone skilled in the art, Flash EEPROM devices are instead generally byte- or word-organized, with an eight- or sixteen-bit-wide data bus.

Each memory cell 1 in the memory matrix has a drain electrode connected to a respective bit line BL, a source electrode connected to a matrix source plane 22 common to all the memory cells 1, and a control-gate electrode connected to a respective word line WL.

All the bit lines BL are connected to a column address decoding and selection circuit 2, which is also supplied with a column address signal bus 3 and which, depending on the logic state of the column address signals, electrically connects one bit line BL to an output signal line 4. Line 4 is connected, through a switch 5, to a sensing circuit 6 or to a programming load circuit 7, depending on the position of the switch 5. The sensing circuitry 6 is supplied with a power supply voltage applied to a chip pad VCC, while the programming load circuitry 7 is supplied with a programming power supply voltage applied to a chip pad VPP. The sensing circuitry 6 and the programming load circuitry 7 are connected, through respective signal lines 12 and 13, to a data input/output buffer circuit 14, which is also connected to a data input/output chip pad I/O.

All the word lines WL are connected to a row address decoding and selection circuit 8, which is also supplied with a row address signal bus 9.

The column address signal bus 3 and the row address signal bus 9 are generated by an address signal input buffer circuit 10, which is supplied by the address input signals applied to address input chip pads ADD.

Redundancy memory cells 1' are further provided in the memory matrix; in the example shown, the redundancy memory cells 1' are connected to at least one of redundancy bit line BL' and redundancy word line WL'.

The redundancy bit line BL' is connected to a redundancy column selection circuit 17 controlled by a redundancy column selection signal 18 to electrically connect the redundancy bit line BL' to the signal line 4; the redundancy column selection signal 18 is supplied by a column redundancy register 15 which can be programmed to store (permanently) an address of a bit line BL containing a defective memory cell 1; to this purpose, the column redundancy register 15 is supplied with the column address signal bus 3; the redundancy column selection signal 18 also is provided to the column address decoding and selection circuitry 2, for inhibiting the selection of the bit lines BL.

The redundancy word line WL' is connected to a redundancy row selection circuit 16 controlled by a redundancy row selection signal 19 to select the redundancy word line WL'; the redundancy row selection signal 19 is supplied by a row redundancy register 20, which can be programmed to store (permanently) an address of a word line WL containing a defective memory cell 1; to this purpose, the row redundancy register 20 is supplied with the row address signal bus 9; the redundancy row selection signal 19 also supplies the row address decoding and selection circuitry 8, for inhibiting the selection of the word lines WL.

The memory matrix source plane 22 can be alternatively connected, through a switch 21, to the chip pad VPP or to a ground line GND.

The method according to the present invention provides for initially programming all the memory cells 1 of the Flash EEPROM device; in the following, by "programming" and "erasing" it is intended the action of transferring to and removing electrons from the floating gate of the memory cell, respectively; a programmed memory cell has a threshold voltage higher than that of an erased memory cell, so that when it is addressed in a read mode, it does not conduct a channel current; a programmed memory cell is often referred to as being a "0" while an erased memory cell is referred to as being a "1". Steps providing for programming all the memory cells 1 of the memory device are generally already present in known test sequences, and are called "ALL 0".

To program all its memory cells 1, the memory device is put in the programming mode; the chip pads VCC and VPP are respectively connected to a 5 V voltage source and to a 12 V (approximately) voltage source, and the various memory cells 1 are sequentially addressed by sequentially changing the logic combination of the address signals at the address chip pads ADD. The switches 5 and 21 are in the positions shown in continuous line in the drawing, so that the selected bit line BL is connected to the programming load circuitry 7, and the source electrode of the memory cells 1 is grounded; the signal applied at the pad I/O must be such that the programming load circuitry 7 connects the signal line 4 to the VPP pad. The row address decoding and selection circuitry 8 raises the voltage of the selected word line WL to the programming voltage applied at the pad VPP. Any of the known programming algorithms can be used.

After the programming step has been completed, the memory cells 1 are in a high threshold voltage condition.

Each memory cell 1 is addressed to verify if it has been correctly programmed; the memory device is put in the read mode, the switch 5 is switched in the position shown in dashed line in the drawing, so that the signal line 4 is connected to the sensing circuitry 6. Each memory cell 1 is addressed by sequentially changing the signals at the pads ADD; the row address decoding and selection circuitry 8 raises the voltage of the selected word line WL to the voltage value applied at the pad VCC. The information stored in the currently addressed memory cell 1 is read out by the testing machine at the pad I/O. This step is performed by connecting the pad VCC of the memory device to a voltage source supplying a voltage equal to the minimum value for which the working of the memory device is assured (VCCmin), to maximize the sensitivity of the sensing circuitry 6. In one aspect of the invention, VCCmin is approximately 3.5 volts. If some memory cells 1 exist which are not correctly programmed, the programing step is repeated. Otherwise, the following step is performed.

All the memory cells 1 are then submitted to a preliminary electrical erasure for a time much shorter than the average erasing time of the memory cells 1. To this purpose, the switch 21 is switched in the position shown in dashed line in the drawing, so that the source electrode of the memory cells 1 is connected to the voltage present at the pad VPP (approximately 12 V); all the word lines WL are kept grounded. The preliminary erasing time can for example be of 1 ms, i.e., much shorter than the average erasing time which is in the range of 1 s; in this way it is assured that if fast erase bits (i.e., memory cells which erase much more quickly than the average memory cell) are present in the memory matrix, they are almost completely erased, while standard bits are still almost entirely programmed.

Each memory cell 1 is then addressed to read its programing condition; differently from the previous read step, the pad VCC is connected to a voltage source supplying a voltage that is slightly higher than VCCmin, to prevent the information read from being affected by noise problems; in practice, it is usually sufficient that the voltage applied to the VCC pad is equal to VCCmin+300 mV. If fast erase bits are present, they are read as non-programmed (erased) at the pad I/O. The addresses of such non-programmed bits are memorized by the testing machine.

The erasing of the memory cells 1 is then completed, so that all the memory cells 1 are brought to the low threshold voltage condition.

The fast erase bits are now redunded (i.e., functionally replaced) by redundancy memory cells 1'; the addresses of the fast erase bits memorized by the testing machine are programmed into the redundancy registers of the memory device associated with the redundancy memory cells 1' that are chosen to functionally replace the fast erase bits. With reference to the example shown in the drawing, if one fast erase memory cell 1" exists, it can be redunded by functionally replacing the bit line BL" to which it is connected with the redundancy bit line BL', or by functionally replacing the word line WL" to which it is connected with the redundancy word line WL'; in the first case, the column address of the bit line BL" is programmed into the column redundancy register 15, so that any successive attempt to address the bit line BL" is recognized by the column redundancy register 15, which activates the signal 18 to inhibit the selection of the bit line BL" and to select the redundancy bit line BL'; in the second case, the row address of the word line WL" is programmed into the row redundancy register 20, so that any successive attempt to address the word line WL" is recognized by the row redundancy register 20, which activates the signal 19 to inhibit the selection of the word line WL" and to select the redundancy word line WL'.

Although the method according to the present invention has been described in connection with a simplified Flash EEPROM memory device with only one input/output data bit, the present invention contemplates that such a method can be used for byte- or word-organized memory devices.

Further, the method according to the present invention can be included in a more comprehensive test sequence that comprises known test modes such as data retention of the memory cells ("life test").

It will be appreciated that, although a specific embodiment of the invention has been described herein for purposes of illustration, various modifications may be made without departing from the spirit and scope of the invention. Accordingly, the invention is not limited except as by the appended claims.

I claim:

1. A method for in-factory testing of a flash EEPROM device comprising a matrix of memory cells and redundancy memory cells for functionally substituting defective memory cells, characterized by comprising the following steps:

a) programming all the memory cells of the memory device;

b) submitting all the memory cells of the memory device to a preliminary electrical erasure for a time much shorter than an average erasing time of the memory cells;

c) reading the information stored in all the memory cells of the memory device;

d) memorizing the addresses of defective memory cells which at step c) have been read as erased memory cell; and e) storing the addresses of the defective memory cells in redundancy registers of the memory device, associated to redundancy memory cells which must substitute the defective memory cells.

2. The method according to claim 1, characterized in that the time duration of said preliminary electrical erasure is three order of magnitude shorter than said average erasing time.

3. The method according to claim 1, characterized in that during step c) the memory device is supplied with a voltage supply substantially equal to a minimum voltage supply value admissible for the memory device.

4. The method according to claim 1, characterized in that between step a) and step b) there is performed a verify step providing for reading of the information stored in all the memory cells to verify their programing state.

5. The method according to claim 4, characterized in that during the verify step the memory device is supplied with a voltage supply substantially equal to a minimum voltage supply value admissible for the memory device.

6. The method according to claim 1, characterized in that between steps d) and e) there is performed an electrical erasure of all the memory cells for a time substantially equal to said average erasing time.

7. A method of testing an electrically erasable memory device, comprising:

subjecting matrix memory cells of said memory device to a programming routine;

implementing upon said cells an electrical erasing routine for a duration that is substantially less than the time required to insure substantially full erasure of said cells;

reading said cells;

identifying as defective those cells that are erased; and substituting for each defective cell a redundant memory cell.

8. The method of claim 7 wherein said duration is approximately three orders of magnitude less than said time required to insure substantially full erasure of said cells.

9. The method of claim 7, further comprising, after said subjecting, verifying that said cells are in a programmed state.

10. The method of claim 9 wherein said verifying comprises supplying said memory device with a supply voltage substantially equal to the minimum supply voltage said device requires.

11. The method of claim 7, further comprising, after said identifying, subjecting said cells to said erasing routine for a duration substantially equal to said time required to insure substantially full erasure of said cells.

12. The method of claim 7 wherein said reading comprises supplying said memory device with a supply voltage that is substantially equal to the minimum supply voltage required to insure proper operation of said device.

* * * * *